United States Patent [19]

Humphrey

[11] 4,096,438

[45] Jun. 20, 1978

[54] WALL THICKNESS GAUGE AND METHOD UTILIZING A REED SWITCH AND MAGNET MEANS ON OPPOSITE SIDES OF THE WALL

[76] Inventor: Frederick H. Humphrey, 7 Orchard St., Markham, Ontario, L3P2S9, Canada

[21] Appl. No.: 742,844

[22] Filed: Nov. 18, 1976

[51] Int. Cl.² .................................... G01R 33/12
[52] U.S. Cl. ............................................ 324/229
[58] Field of Search ...................... 324/34 R, 34 TK

[56] References Cited

U.S. PATENT DOCUMENTS

| 2,834,938 | 5/1958 | Cunningham | 324/34 TK |
| 3,397,347 | 8/1968 | Hoeppel | 324/34 RS |
| 3,803,482 | 4/1974 | Steingroever | 324/34 TK |

FOREIGN PATENT DOCUMENTS

| 1,046,344 | 12/1958 | Germany | 324/34 TK |

OTHER PUBLICATIONS

McMaster, R. C., Nondestructive Testing Handbook, vol. II, The Ronald Press, 1963, pp. 34.15–34.18.

*Primary Examiner*—Robert J. Corcoran
*Attorney, Agent, or Firm*—Sim & McBurney

[57] ABSTRACT

This invention relates to a method and apparatus for determining the thickness of a wall of non-magnetic material. On one side of the wall is positioned a magnetic means adapted to create a magnetic field of which a portion extends beyond the other side of the wall. On the other side of the wall is positioned a detecting means capable of indicating when the strength of at least one directional component of the field reaches a given level at the location of the detecting means. The component on one side of the wall is maintained stationary while the other component is altered in such a way that the strength of the said at least one directional component of the field at the detecting means reaches the given level, at which point the detecting means will indicate same.

9 Claims, 3 Drawing Figures

WALL THICKNESS GAUGE AND METHOD UTILIZING A REED SWITCH AND MAGNET MEANS ON OPPOSITE SIDES OF THE WALL

This invention relates generally to a method and apparatus adapted to determine the thickness of a wall or partition of non-magnetic material.

BACKGROUND OF THE INVENTION

There are many technical areas in which it would be of advantage to have a quick and reliable means of establishing the thickness of certain kinds of walls or partitions. It is common practice to store certain kinds of gases and liquids in tanks which may be made of plastic, copper, aluminum and other materials. In certain installations, it is found that tanks made of copper, aluminum or certain other metals tend to corrode and are eaten away by the material being stored, thus diminishing the wall thickness. For vessels made of plastics, the action tends to be a different one. The effect of storing chemicals in plastic containers is not usually a thinning of the plastics, but rather a chemical deterioration of the properties of the plastic material, resulting in loss of strength. In some applications, however, plastic walls too are found to be eroded.

In the specific case of vessels made of plastics, such as glass fibres reinforced vessels which are commonly used now in the chemical industry instead of stainless steel, it would be a distinct advantage to know the actual thickness of the vessel wall in the first instance, i.e. immediately after manufacture and prior to filling the vessel with the intended substance. The technique used in the making of such vessels is ordinarily by "hand layup", and this involves the combination of reinforcing glass fibres in the form of mats or woven rovings or cloths with liquid resins on a mold. Since the process is carried out by hand, the thickness of the laminate can vary and there is no convenient way to know what this thickness is. Where doubt exists, the current practice is to drill a hole which then requires repairing. Both the manufacturers of the plastics equipment and the buyers of the equipment have a real need to be able to check the thickness of the material non-destructively. This particular aim is one of those kept in mind during development of this invention.

In addition to vessel walls, it would be useful to be able to measure non-destructively and with good accuracy the thickness of plastics and non-magnetic pipe walls. The invention herein to be described also finds application in this field. Furthermore, measurement of the thickness of hulls of reinforced plastics boats can also be accomplished utilizing the invention herein set forth.

These are only some of the many situations in which the advantage of being able to readily, accurately and non-destructively establish the thickness of a wall or partition is self-evident.

BACKGROUND OF THIS INVENTION

The prior art contains a number of approaches to the question of determining the thickness of a wall or partition, or alternatively the thickness of a coating on a substance with ferromagnetic properties. One such approach is exemplified in U.S. Pat. No. 3,397,347, Hoeppel, which relates to a magnetic displacement transducer, and which was issued on Aug. 13, 1968. This prior art patent discloses the use of a magnetic reed switch in which ferromagnetic reeds extend toward each other within a sealed, glass capsule, with the reeds having terminals extending outside of the capsule for attachments to electrical apparatus, together with a solenoid coil wrapped around the magnetic reed switch in such a way that when the coil is energized by the passage of current therethrough, a magnetic field is created which is strong enough to magnetically bring the reeds into contact. Hoeppel utilizes in particular a single pole double throw magnetic reed switch in which a first terminal is electrically connected with a second terminal whenever a magnetic field is not applied, and is electrically connected with a third terminal whenever a magnetic field is applied. When the magnetic field is applied, the contact between the first and second terminals is broken. Hoeppel connects the solenoid surrounding the magnetic reed switch in series with the first and second terminals of the reed switch itself, in such a way that, when a constant DC source of current is applied, the energization of the solenoid will immediately break the solenoid's own circuit and cause it to shut off, whereupon the contact reeds again come together to energize the solenoid, followed by breaking of the contact, and so on ad infinitum. This results in a continuous short term interruption of the current through the solenoid, and turns it into a pulsed signal. Hoeppel connects a capacitor across the solenoid in order to reduce the vibration rate of the reeds and to stabilize the vibration.

The rate of vibration of the prior art device just described changes if the magnetic flux in the area of the magnetic reed switch increases. The vibration will either increase or decrease, depending upon the polarity of the solenoid with respect to the ambient magnetic flux. A reading which can be correlated with the strength of the ambient magnetic flux is obtained either by a frequency meter which is able to indicate the frequency of the opening and closing of the reed switch, or by an ammeter connected in series with the reed switch and the solenoid, the reading of which will vary to some extent in proportion to the change in frequency rate, so long as the ammeter is capacitively smoothed. This prior art device thus is able to provide a form of reading, either on a galvanometer or on a frequency meter, which can be pre-calibrated against known magnetic flux densities, in order to provide a rough idea of the strength of a magnetic field. In this manner, the movement at a distance of a magnetic means such as a permanent magnet can be detected on the read-outs provided.

Because the distance read-out for the device just described is based on the displacement of a galvanometer needle, there is necessarily a limitation to the accuracy that can be obtained. Moreover, since the measurement technique of this prior art method involves a change in the pulse rate of the solenoid and of the magnetic reeds, it necessarily follows that the residual magnetism in the reeds will change and will not be constant. This could introduce an error into the reading that the device is able to provide.

In view of the foregoing, it is an aspect of the present invention to eliminate the problem of varying residual magnetism associated with a magnetic reed switch, and to greatly improve the accuracy of the distance read-out that can be provided, particularly in relation to the measurement of the thickness of a wall. Accordingly, this invention provides, a method of determining the thickness of a wall of non-magnetic material, the steps of: positioning magnetic means on one side of the wall to set up a magnetic field of which a portion extends beyond the other side of the wall, positioning on the other side of the wall a magnetic reed switch within a solenoid, energizing the solenoid with a pulsed DC signal of unvarying frequency to alternately open and close the reed switch and thereby to achieve in the reeds of the reed switch a substantially steady level of residual magnetism, and causing the magnetic field at the reeds of the reed switch to increase until the reed switch ceases to open and close alternately, by causing the reed switch and solenoid to approach said other side of the wall, the method including stopping the approach when the magnetic reed switch ceases to open and close alternately, noting a distance-related measurement governed by the separation between the wall and the magnetic reed switch, and deriving from said measurement the thickness of the wall by virtue of a prior calibration of the scale of such measurement.

In another aspect, this invention provides apparatus for determining the thickness of a wall of non-magnetic material, comprising: magnetic means adapted to be positioned on one side of the wall to set up a magnetic field of which a portion extends beyond the other side of the wall, a magnetic reed switch and solenoid coil encircling the magnetic reed switch, the reed switch being adapted to be positioned on the other side of the wall, within the field of said magnetic means, first means for energizing the solenoid with a pulsed DC signal of unvarying frequency to alternately open and close the reed switch and thereby to achieve in the reeds of the reed switch a substantially steady level of residual magnetism, second means for causing the magnetic field at the reeds to increase until the magnetic reed switch ceases to open and close alternately, said second means including a housing adapted to be held in contact with the other side of the wall opposite the position of the magnetic means, and structure associated with the housing for supporting the magnetic reed switch and solenoid coil combination and for causing them to move along a line normal to the wall, the increase in the magnetic field coming about due to the approach of the magnetic reed switch to the magnetic means, and distance-determining means varying directly with the reed switch position, and which can be pre-calibrated against a test piece of known thickness in order to give a reading corresponding to the wall whose thickness is to be measured.

One embodiment of this invention is illustrated in the accompanying drawings, in which like numerals denote like parts throughout the several views, and in which.

Figure 1:
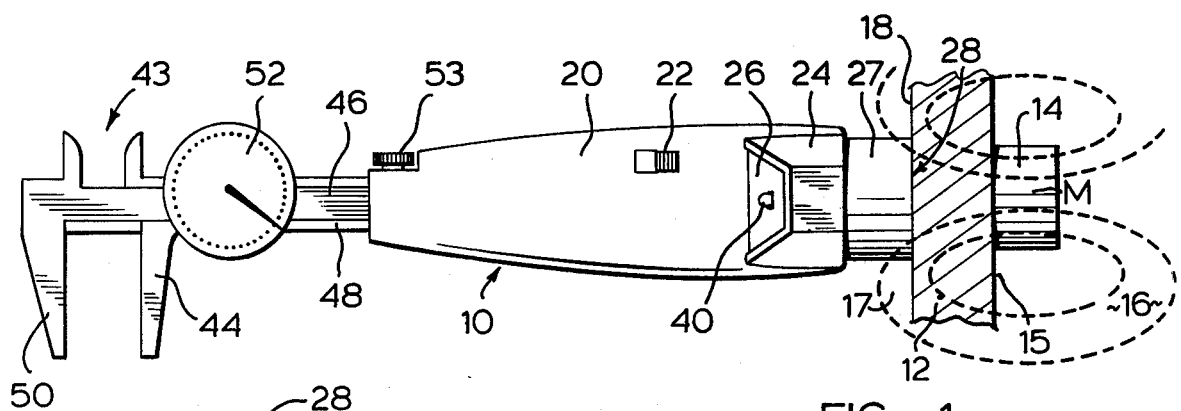
FIG. 1 is a plan view of a device constructed in accordance with this invention.

Attention is first directed to FIG. 1, which shows at 10 an apparatus for determining the thickness of a wall 12 of non-magnetic material. The apparatus 10 is adapted for utilization with magnetic means 14 constituted in this particular embodiment by a permanent magnet M, and which is adapted to be positioned on one side 15 of the wall 12 to set up a magnetic field 16 of which a portion 17 extends beyond the other side 18 of the wall 12.

The apparatus 10 includes a body portion 20 shaped to constitute a handle by which the apparatus may be manually grasped. The body portion 20 includes an on-off switch 22, an upstanding read-out portion 24 having a read-out face 26, and a cylindrical portion 27 projecting from one end thereof, the cylindrical portion 27 having a flat terminating wall 28 which is adapted to be placed into contact with the side 18 of the wall 12 at a location aligned with the magnetic means 14 and with the field 16 generated by the magnetic means 14.

Figure 2:
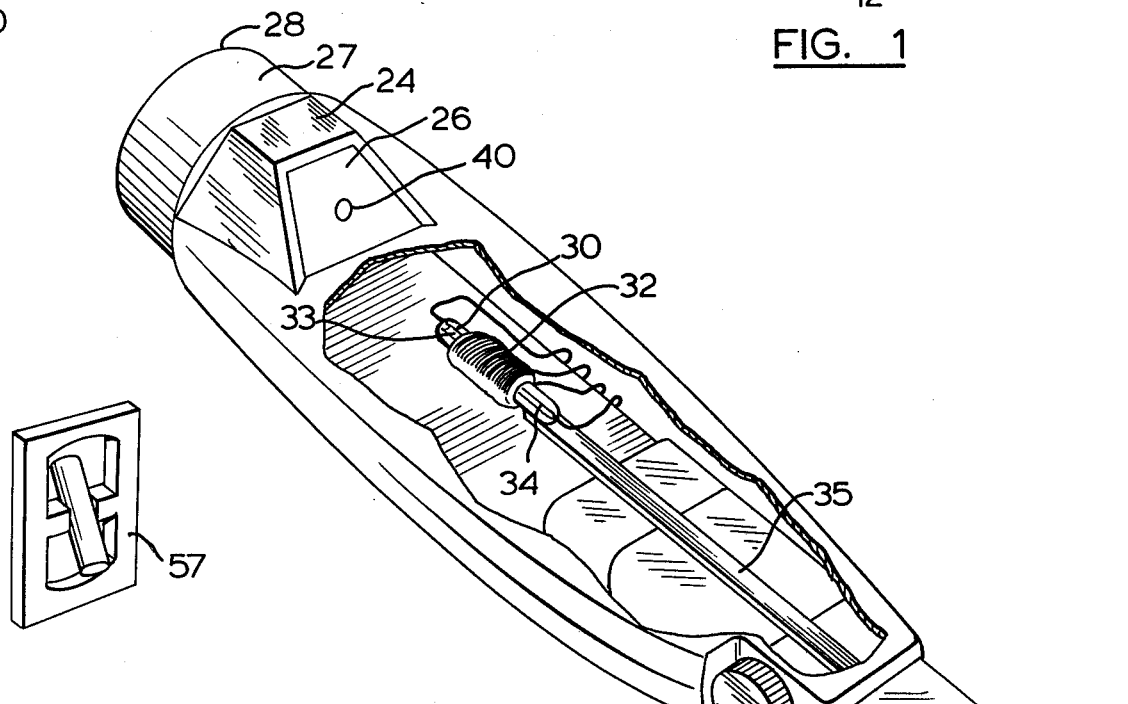
FIG. 2 is a partly broken-away partial view of the device of FIG. 1.

Provided within the housing 20, as better seen in FIG. 2, is a magnetic reed switch 30 and a solenoid coil 32 encircling the magnetic reed switch in such a way that energization of the solenoid coil will cause the two internal reeds 33 and 34 of the switch 32 to close into contact, and complete an electrical connection between the two terminals at either end of the magnetic reed switch 30. The magnetic reed switch 30 and the solenoid coil 32 are supported at the end of an axially slidable member 35 which is adapted to be reciprocated in a controlled manner toward and away from the face 28 of the cylindrical portion 27 described earlier. During such controlled reciprocation, the magnetic reed switch 30 and its associated solenoid coil 32 are carried axially toward and away from the face 28.

Means are provided for energizing the solenoid 32 with a pulsed DC signal of unvarying frequency to alternately open and close the reeds 33 and 34 of the reed switch 30, and thereby to achieve in the reeds 33,34 a substantially steady level of residual magnetism. The means for carrying this out is shown diagramatically in the circuit diagram of FIG. 3 to which attention is now directed. The basic operating unit of the circuit is a timer 37 which is a well-known item among solid-state components. A timer component is an integrated circuit chip which has a number of terminals to which various resistances, capacitances, inputs and outputs can be connected. A typical timer is normally capable of mono-stable or bi-stable operation, and in particular, it is possible to wire the various resistances and capacitances to the timer such that a square-wave repeating pulsed signal can be generated by the timer, the frequency of which depends upon the selection of the resistances and the capacitances. It is believed not necessary to deal in detail with the internal construction or operation of the well-known solid-state timer integrated circuit, because the unit is very well known in the solid-state field.

In the circuit utilized with the apparatus of this invention, the timer is wired in such a way that it generates a regular, repeating pulsed DC signal which is utilized to operate the solenoid coil 32 encircling the magnetic reed switch 30. The pulsed signal will thus cause the reeds 33,34 of the magnetic reed switch 30 to close and open in a regularly repeating sequence and at a steady frequency. Such operation will give rise to a steady and unvarying degree of residual magnetism within the reeds 33,34 which is considered essential to the proper operation of the apparatus of this invention, and to its success in terms of determining the thickness of a wall to a high degree of accuracy. The reeds 33 and 34 of the magnetic reed switch 30 are wired in series with a resistance $R_4$, a light-emitting diode (LED) 40, and a low-voltage power source such as the well-known 9-volt transistor-type battery. The resistance $R_4$ is provided to protect the LED from damage due to excessive current.

A resistance $R_3$ is wired in series with the solenoid 32, and here again its value is selected to enable the solenoid to achieve closure of the reeds 33,34 without allowing an excessive current to pass through the solenoid coil, thus wasting battery power and possibly generating too much resistance power dissipation in the solenoid.

Figure 3:
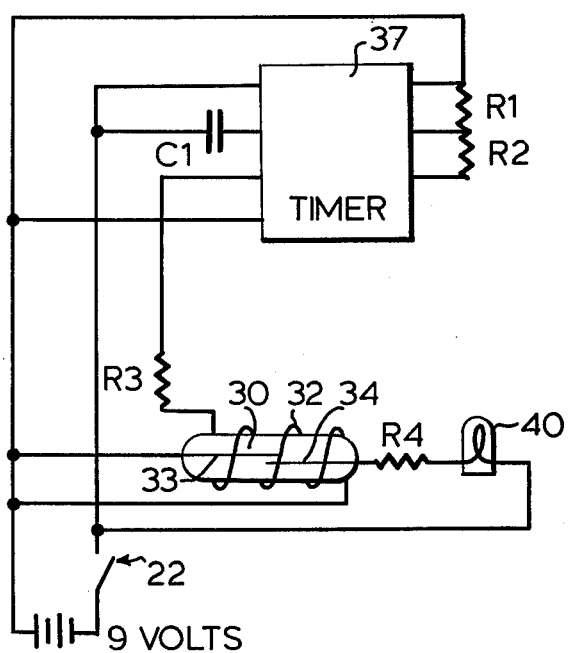
FIG. 3 is a circuit diagram utilized in the device of FIG. 1.

In FIG. 3, the capacitance $C_1$ and the resistances $R_1$ and $R_2$ are related only to the matter of the frequency and duty cycle of the square-wave which is generated by the timer.

As an example, if one selects a standard time such as that designated as LM555CN, it is appropriate to utilize the following values:

$C_1$ = 1 μfd capacitor
$R_1$ = 51,000 ohm resistor
$R_2$ = 16,000 ohm resistor
$R_3$ = 47 ohm resistor
$R_4$ = 100 ohm resistor
Coil, 600 turns 0.011 diameter enamelled copper wire
Battery: 9 volt Mallory TR-146X or equivalent In FIGS. 1 and 2, the light-emitting diode, designated by the numeral 40, is supported centrally of the read-out face 26 on the portion 24.

In the normal operation of the apparatus shown in the drawings, the magnetic means 14 is held tightly against the one side 15 of the wall 12, while the member 35 carrying the magnetic reed switch 30 and the associated solenoid coil 32 is moved progressively toward the magnetic means 14, which means toward the face 28 of the cylindrical portion 27.

It wil be appreciated that, so long as the magnetic field flux density at the reeds 33 and 34 is relatively weak, when the switch 22 is thrown and the timer begins to produce a pulsed DC signal to open and close the circuit through the solenoid 32, the reeds 33,34 will close and open in an alternating sequence at the same frequency as the square-wave pulse, and this will cause the LED 40 to flash on and off at the same frequency. Thus, to begin with the magnetic means 14 is placed against the one side of the wall 15, the magnetic reed switch 30 and its associated solenoid coil 32 is withdrawn to its furthest point away from the magnetic means 14, the switch 22 is closed to begin the flashing of the LED 40, and then the longitudinal member 35 is gradually advanced toward the face 28 which carries the magnetic reed switch 30 also closer to the face 28 and into an ever-strengthening magnetic field aligned therewith, until the point is reached where the ambient magnetic flux density at the reeds 33,34 is strong enough to allow the reeds to remain closed and in contact even when the current through the solenoid 32 is arrested in the "off" part of the pulsed signal from the timer 37. This change will be clearly seen by the operator in the fact that the LED 40 will change from a pulsed signal to a steady glow, and at that particular point the advance of the longitudinal member 35 can be arrested and the thickness of the wall can be read on means subsequently to be described.

The means for allowing the thickness of the wall 12 to be read directly from the apparatus, and to permit a precalibration, is best seen in FIGS. 1 and 2. In practice, applicant has used the well-known vernier calipers device, somewhat modified, in order to allow these operations to take place. In FIG. 1 the "head" end of a vernier calipers is shown at 43. The vernier calipers includes an inner jaw 44 which is integral with a central sliding member 46 which becomes the elongated member 35 within the housing 10. The elongated member 35 slides with respect to an outer channel member 48 which is integral with the outer jaw member 50. Many vernier calipers have a dial attachment 52 which allows a direct read-off, usually in thousandths of an inch, of the specific distance between the jaws 44 and 50. The entire assembly projecting leftwardly from the housing 10 is adjustable longitudinally with respect to the housing 10, and this adjustment is capable of being fixed by an adjustment wheel 53.

To permit the prior calibration of the device shown in the drawings, the wheel 53 is first loosened, to allow the entire vernier calipers portion, together with the magnetic reed switch 30, to slide longitudinally with respect to the housing 10. The jaws 44,50 of the vernier calipers are closed tightly together, and the magnetic means 14 is placed flatly against the face 28 of the cylindrical portion 27. From its furthest pulled out position, the vernier calipers portion is gradually moved inwardly with respect to the housing 10 while the LED and its associated circuit is in the flashing mode. When the LED ceases to flash and changes to a steady light, the movement of the vernier calipers is stopped with respect to the housing 10, and the wheel 53 is tightened to lock the calipers in position. The device is then calibrated.

In use, the magnetic means is placed against one side of the wall, the central point of its magnetic field is detected on the other side of the wall by means of a device such as a medially pivoted finder magnet 57, the central spot of the magnetic field 16 is marked on the other side 18 of the wall, and then the main apparatus, with the jaws 44,50 initially closed, is placed against the marked spot and gradually the jaws are opened to carry the magnetic reed switch 30 toward the magnetic means 14 aligned with the magnetic field 16. During this process, of course, the circuit has been turned on and the LED is flashing. When the point is reached where the LED ceases to flash, movement apart of the jaws 44,50 is arrested, and the reading of the calipers will be exactly that of the separation between the magnetic means 14 and the face 28, which of course will be the thickness of the wall 12.

It will be appreciated that the device of this invention can be utilized in one of two ways, depending upon the direction of the magnetic field in the solenoid 32 compared with the direction of the magnetic field sustained by the magnetic means 14. If these two fields are magnetically coupled, i.e., if the direction from north to south in each field is the same, then the LED will eventually change from intermittent flashing to continuously "on". However, if the magnetic field directions are reversed, i.e., if the direction from north to south is opposite in the two fields, then the change in the LED will be from intermittently flashing to completely off. In either case, what happens is that the magnetic reed switch ceases to open and close alternately and the LED ceases to flash intermittently. It is this signal which would be taken by the operator to indicate that movement apart of the jaws 44,50 should be stopped, and the thickness of the wall read.

It has been found that the device of this invention is capable of accurately measuring non-magnetic wall thicknesses to an accuracy within five thousandths of an inch.

What I claim is:

1. A method of determining the thickness of a wall of non-magnetic material, comprising the steps of:
   positioning magnetic means on one side of the wall to set up a magnetic field of which a portion extends beyond the other side of the wall, positioning on the other side of the wall a magnetic reed switch within a solenoid, energizing the solenoid with a pulsed DC signal of unvarying frequency to alternately open and close the reed switch and thereby to achieve in the reeds of the reed switch a substantially steady level of residual magnetism, and causing the flux density component of said magnetic field at the reeds of the reed switch to increase until the reed switch ceases to open and close alternately, by causing the reed switch and solenoid to approach said other side of the wall, the method including stopping the approach when the magnetic reed switch ceases to open and close alternately, noting a distance-related measurement governed by the separation between the wall and the magnetic reed switch, and deriving from said measurement the thickness of the wall by virtue of a prior calibration of the scale of such measurement.

2. The method claimed in claim 1, in which the flux direction of the solenoid is the same as that of said magnetic means, and in which the flux density component is increased by decreasing the distance between the magnetic means and the reed switch until the reed switch remains permanently closed.

3. The method claim in claim 1, in which the flux direction of the solenoid is opposite to that of said magnetic means, and in which the flux density component is increased by decreasing the distance between the magnetic means and the reed switch until the reed switch remains permanently open.

4. The method claimed in claim 1, in which the magnetic means is a permanent bar magnet held with one pole in contact with said one side of the wall, and in which the flux direction of the solenoid is the same as that of the magnet, such that a sufficiently close approach of the reed switch to the magnet causes the switch to remain permanently closed.

5. The method claimed in claim 1, in which the positioning of the magnetic means on one side of the wall is followed by an intermediate step of using a medially pivoted finder magnet to locate and mark on the other side of the wall a spot substantially aligned with the center axis of said permanent bar magnet, such that the reed switch can be moved along a line normal to the wall and aligned with said spot.

6. Apparatus for determining the thickness of a wall of non-magnetic material, comprising:

magnetic means adapted to be positioned on one side of the wall to set up a magnetic field of which a portion extends beyond the other side of the wall, a magnetic reed switch and solenoid coil encircling the magnetic reed switch, the reed switch being adapted to be positioned on the other side of the wall, within the field of said magnetic means, first means for energizing the solenoid with a pulsed DC signal of unvarying frequency to alternately open and close the reed switch and thereby to achieve in the reeds of the reed switch a substantially steady level of residual magnetism, second means for causing the magnetic field at the reeds to increase until the magnetic reed switch ceases to open and close alternately, said second means including a housing adapted to be held in contact with the other side of the wall opposite the position of the magnetic means, and structure associated with the housing for supporting the magnetic reed switch and solenoid coil combination and for causing them to move along a line normal to the wall, the increase in the magnetic field coming about due to the approach of the magnetic reed switch to the magnetic means, and distance-determining means varying directly with the reed switch position, and which can be pre-calibrated against a test piece of known thickness in order to give a reading corresponding to the wall whose thickness is to be measured.

7. The apparatus claimed in claim 6, in which said magnetic means is a permanent bar magnet adapted to be held against the wall with its polar axis normal to the wall, and in which said first means includes a timer circuit adapted to deliver the pulsed DC signal to the solenoid; the apparatus further including a light-emitting means wired in series with the reeds of the reed switch and with a source of electric current, whereby the light-emitting means turns on whenever the reed switch closes, thereby to provide a visible indicator of the state of the reed switch.

8. The apparatus claimed in claim 7, in which said distance-determining means includes a slidable element mounted in the housing for supporting the magnetic reed switch and solenoid coil combination and for causing them to move along a line normal to the wall, and indicia associated with said slidable element enabling a determination of the position of said element when the magnetic reed switch ceases to open and close alternately, and for permitting pre-calibration of the apparatus.

9. The apparatus claimed in claim 8, in which said slidable element is one part of a vernier calipers, and in which the housing defines a handle portion having a flat face at one end for placing against the wall, the vernier calipers extending from the end opposite said flat face.

* * * * *